(12) United States Patent
Chen et al.

(10) Patent No.: US 12,396,095 B2
(45) Date of Patent: Aug. 19, 2025

(54) CIRCUIT BOARD WITH LOW GRAIN BOUNDARY DENSITY AND FORMING METHOD THEREOF

(71) Applicant: Unimicron Technology Corp., Taoyuan (TW)

(72) Inventors: Chien Jung Chen, Taoyuan (TW); Jia Hao Liang, Taoyuan (TW); Ching Ku Lin, Taiyuan (TW)

(73) Assignee: Unimicron Technology Corp, Taoyuan (TW)

( * ) Notice: Subject to any disclaimer, the term of this patent is extended or adjusted under 35 U.S.C. 154(b) by 405 days.

(21) Appl. No.: 18/065,606

(22) Filed: Dec. 13, 2022

(65) Prior Publication Data

US 2024/0121896 A1    Apr. 11, 2024

(30) Foreign Application Priority Data

Oct. 11, 2022    (TW) ................... 111138447

(51) Int. Cl.
*H05K 5/00*    (2025.01)
*H05K 1/11*    (2006.01)
*H05K 3/06*    (2006.01)
*H05K 3/46*    (2006.01)

(52) U.S. Cl.
CPC ............. *H05K 1/112* (2013.01); *H05K 3/062* (2013.01); *H05K 3/4644* (2013.01)

(58) Field of Classification Search
CPC ......... H05K 1/112; H05K 3/062; H05K 3/464
See application file for complete search history.

(56) References Cited

U.S. PATENT DOCUMENTS

| 2017/0263441 A1* | 9/2017 | Orihashi | ............. H01L 21/0259 |
| 2019/0174632 A1* | 6/2019 | Shuto | .................... H05K 3/427 |
| 2020/0058609 A1* | 2/2020 | Jin | .................... H01L 23/53238 |

FOREIGN PATENT DOCUMENTS

| CN | 111463185 A | 7/2020 |
| TW | 201417647 A | 5/2014 |
| TW | 201925541 A | 7/2019 |
| TW | 202147687 A | 12/2021 |

* cited by examiner

*Primary Examiner* — Pete T Lee
(74) *Attorney, Agent, or Firm* — CKC & Partners Co., LLC

(57) ABSTRACT

The present disclosure provides a circuit board including a first circuit layer, a dielectric layer on the first circuit layer, and a seed layer on the dielectric layer and directly contacting the first circuit layer, in which a top surface of the seed layer includes a levelled portion. The circuit board also includes a second circuit layer on the levelled portion of the seed layer, in which a grain boundary density of the second circuit layer is lower than that of a portion of the seed layer directly contacting the first circuit layer.

7 Claims, 14 Drawing Sheets

CIRCUIT BOARD WITH LOW GRAIN BOUNDARY DENSITY AND FORMING METHOD THEREOF

CROSS-REFERENCE TO RELATED APPLICATION

This application claims priority to Taiwan Application Serial Number 111138447, filed Oct. 11, 2022, which is herein incorporated by reference in its entirety.

BACKGROUND

Field of Invention

The present disclosure relates to a circuit board and the forming method thereof. More particularly, the present disclosure relates to a circuit board having a circuit layer with a low grain boundary density.

Description of Related Art

A manufacturing process of a circuit board generally includes forming a circuit layer on a seed layer and then removing the residual seed layer by etching, thus forming a circuit with a specific pattern. However, during etching of the seed layer, the circuit layer may also be etched by the etchant, leading to a loss in thickness or width of the circuit layer. As a result, the line width and density in the circuit board are limited, affecting the functional performance of the circuit board. Therefore, how to solve the foregoing problems to improve the performance of the existing circuit board is an important subject in this field.

SUMMARY

According to some embodiments of the present disclosure, a circuit board includes a first circuit layer, a dielectric layer on the first circuit layer, and a seed layer on the dielectric layer and directly contacting the first circuit layer, where a top surface of the seed layer includes a levelled portion. The circuit board also includes a second circuit layer on the levelled portion of the seed layer, where a grain boundary density of the second circuit layer is lower than that of a portion of the seed layer directly contacting the first circuit layer.

In some embodiments, the grain boundary density of the second circuit layer ranges from 1 to 2 grain boundaries per 10 μm.

In some embodiments, a thickness of the levelled portion of the seed layer ranges from 1 to 2 angstroms.

In some embodiments, the levelled portion is at the top surface of the seed layer without contacting the first circuit layer or the dielectric layer.

In some embodiments, a line width of the second circuit layer ranges from 7 μm to 9 μm.

In some embodiments, the seed layer and the second circuit layer includes an identical metal material.

In some embodiments, the seed layer and the second circuit layer includes copper metal or copper alloy.

According to some embodiments of the present disclosure, a method of forming a circuit board includes: providing a substrate, a first circuit layer on the substrate, and a dielectric layer covering the first circuit layer; forming an opening that exposes a portion of the first circuit layer in the dielectric layer; forming a seed layer that directly contacts the first circuit layer on the dielectric layer and in the opening; treating the seed layer with a metal levelling agent, such that a top surface of the seed layer forms a levelled portion; forming a second circuit layer on the levelled portion of the seed layer, a grain boundary density of the second circuit layer ranging from 1 to 2 grain boundaries per 10 μm; and removing a first portion of the seed layer exposed by the second circuit layer.

In some embodiments, the metal levelling agent includes hydrogen peroxide, organic acid, inorganic acid, or combinations thereof.

In some embodiments, after treating the seed layer with the metal levelling agent, the levelled portion has a surface roughness lower than that of the seed layer not treated with the metal levelling agent.

In some embodiments, after treating the seed layer with the metal levelling agent, the levelled portion has an arithmetical average roughness (Ra) range from 30 nm to 35 nm.

In some embodiments, after treating the seed layer with the metal levelling agent, the levelled portion includes a first portion on the dielectric layer and a second portion in the opening.

In some embodiments, the method further includes forming a mask layer on the seed layer before treating the seed layer with the metal levelling agent, where the mask layer includes an opening that exposes a second portion of the seed layer.

In some embodiments, the metal levelling agent is used to etch the top surface of the second portion of the seed layer exposed by the mask layer.

In some embodiments, the method further includes removing the mask layer after forming the second circuit layer, such that the first portion of the seed layer is exposed by the second circuit layer.

In some embodiments, removing the first portion of the seed layer exposed by the second circuit layer includes using an etchant to etch the seed layer, and an etching rate of the etchant for the seed layer being greater than that for the second circuit layer.

In some embodiments, removing the first portion of the seed layer exposed by the second circuit layer includes removing the first portion of the seed layer not treated with the metal levelling agent.

In some embodiments, forming the opening that exposes the portion of the first circuit layer includes using a laser drill process to form the opening.

In some embodiments, the method further includes: performing a desmear process after forming the opening and before forming the seed layer.

In some embodiments, forming the seed layer on the dielectric layer and in the opening includes forming the seed layer with a thickness ranging from 0.5 μm to 1 μm.

According to the foregoing embodiments, the circuit layer of the circuit board of the present disclosure has a grain boundary density lower than that of the seed layer, and therefore the line width of the circuit layer can be maintained in a process of removing the seed layer, thus providing a trace with a fine line width in the circuit layer and a high circuit density and further improving the power of the circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
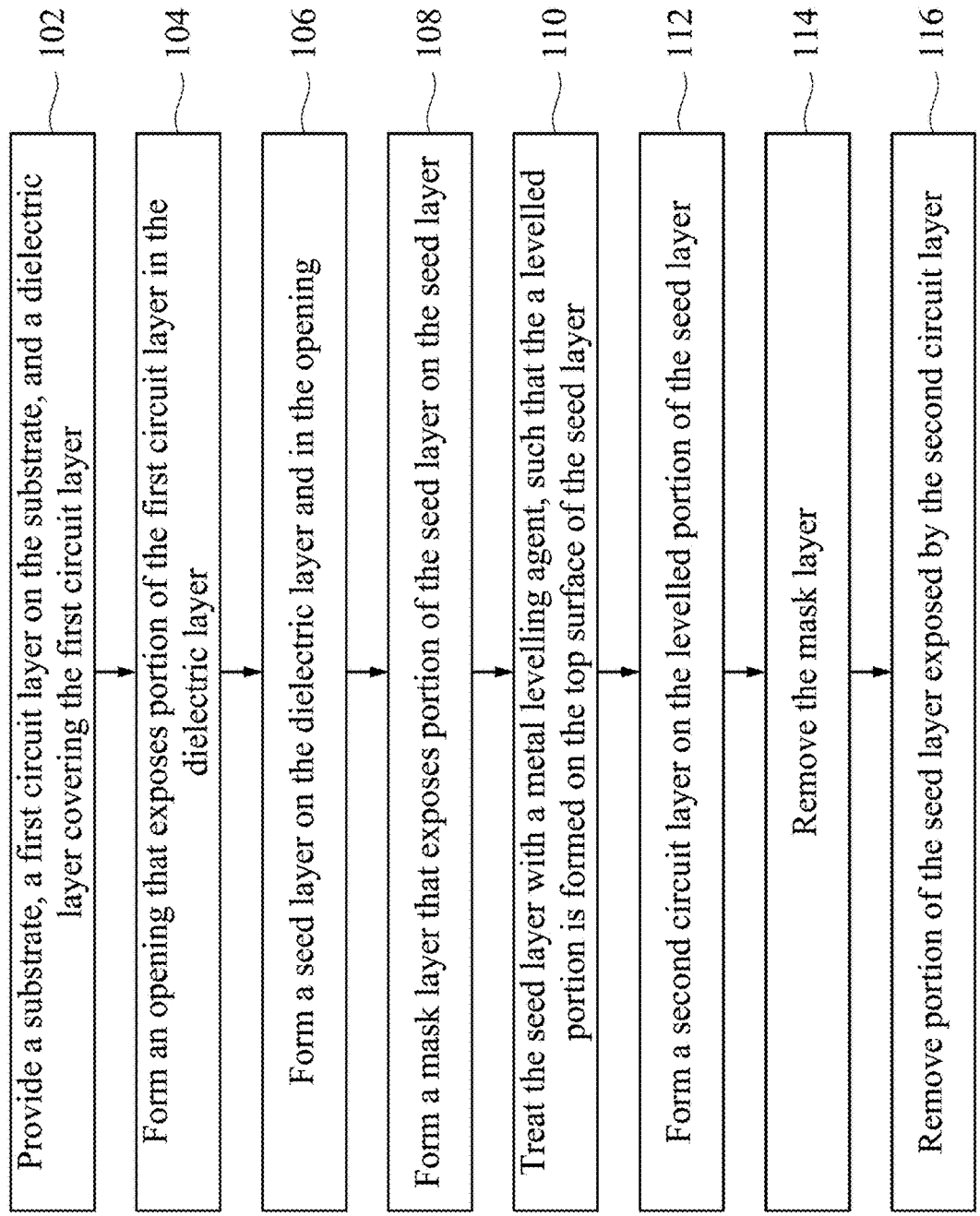
FIG. 1 is a flowchart of a method of forming a circuit board according to some embodiments of the present disclosure.

The following disclosure provides many different embodiments, or examples, for implementing different features of the provided subject matter. Specific examples of components, values, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that although the terms "first", "second", "third", etc., can be used to describe various elements, components, regions, layers and/or parts in this specification, these elements, components, regions, layers and/or parts should not be limited by these terms. These terms are used only to distinguish one element, component, region, layer, or portion from another element, component, region, layer, or part. Therefore, the first element, component, region, layer, or portion discussed below may be referred to as a second element, component, region, layer, or portion without departing from the instructions of the specification.

The present disclosure provides a circuit board and its forming method. The circuit board includes a first circuit layer, a dielectric layer on the first circuit layer, a seed layer on the dielectric layer, and a second circuit layer on the seed layer. A top surface of the seed layer includes a levelled portion, and the second circuit layer is formed on the levelled portion and has a grain boundary density less than that of the seed layer. Because the second circuit layer has a lower grain boundary density than that of the seed layer, the second circuit layer can maintain its line width during a process of removing the seed layer, without the need to compensate for the line width. Thus, the line width of the second circuit layer can be reduced, and the circuit density of the second circuit layer can be increased, thus improving the power performance of the circuit board.

According to some embodiments of the present disclosure, FIG. 1 is a flowchart of a circuit board forming method 100. FIGS. 2A to 2E and FIGS. 2G to 2I are cross sectional views of a circuit board 200 formed according to the method 100 in different intermediate stages of the manufacturing process. The method 100 can be used for forming, for example, the circuit board 200 having a circuit layer with a low grain boundary density in FIGS. 2A to 2I. However, those skilled in the art should understand that, the method 100 can also be used for forming other circuit boards with a low grain boundary density within the scope of the present disclosure.

It should be noted that, unless otherwise stated, when FIGS. 2A to 2E and FIGS. 2G to 2I show or illustrate a series of steps of the embodiments, the description sequence of these steps should not be limited. For example, some steps may be taken in a different order than the described embodiments, some steps may occur simultaneously, some steps may not be required, and/or some steps may be repeated. In addition, additional steps may be performed before, during, or after the illustrated steps to completed form the circuit board.

In order to describe elements included by the circuit board 200, FIGS. 2A to 2E and FIGS. 2G to 2I merely show some elements of the circuit board 200, but a circuit board including additional elements (for example, a protective or solder layer on the circuit layer, a system board electrically connected to the circuit board, etc.) also fall within the scope of the present disclosure.

Figure 2A:
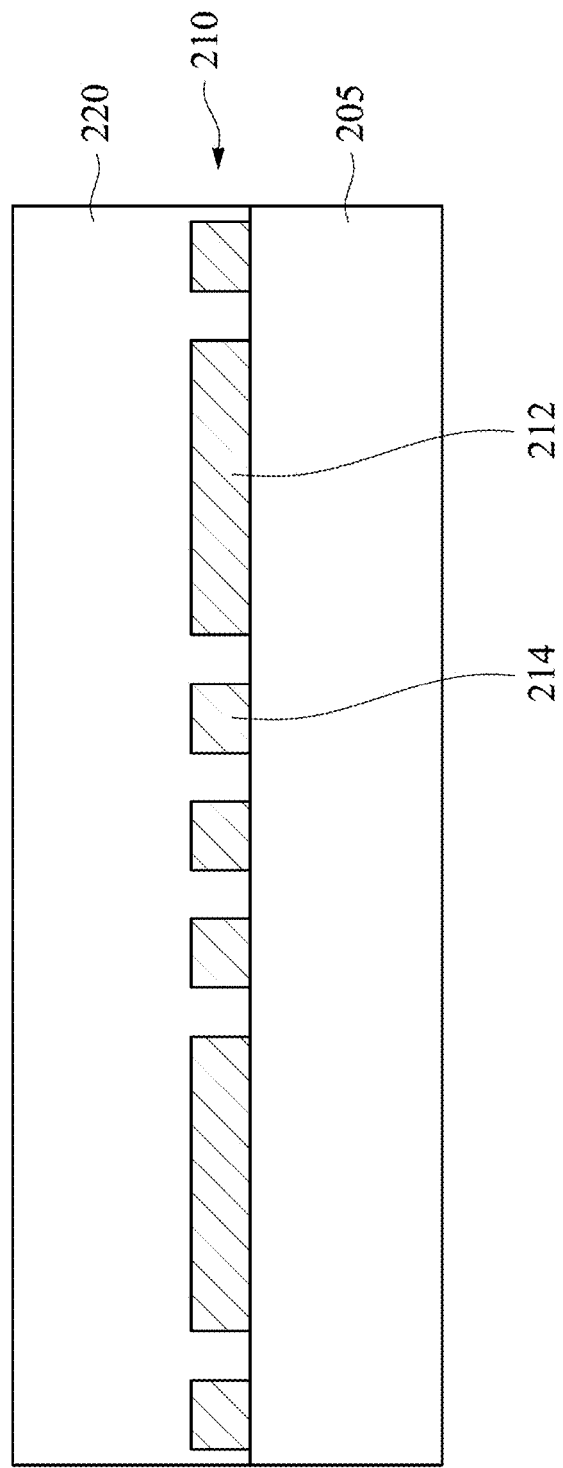
FIGS. 2A to 2E and FIGS. 2G to 2I are cross sectional views of a circuit board in different intermediate stages of a manufacturing process according to some embodiments of the present disclosure.

Referring to FIGS. 1 and 2A, the method 100 starts from step 102, where a substrate 205, a first circuit layer 210 on the substrate 205, and a dielectric layer 220 covering the first circuit layer 210 are provided. The substrate 205, the first circuit layer 210, and the dielectric layer 220 together form a stacked structure. The substrate 205, as a carrying substrate, is used for receiving the first circuit layer 210 and other elements that are subsequently formed. The first circuit layer 210 is formed on the substrate 205 and has an appropriate pattern, such that the first circuit layer 210 includes a first joint pad 212 and a first trace 214. The dielectric layer 220 is formed on the substrate 205 and the first circuit layer 210. The thickness of the dielectric layer 220 is greater than that of the first circuit layer 210, such that the dielectric layer 220 can cover the top surface and side surfaces of the first circuit layer 210.

In some embodiments, the substrate 205 may be a circuit substrate. For example, the substrate 205 may include an insulating layer and circuit layers at the two sides of the insulating layer. Moreover, the substrate 205 may serve as a core layer, and may include at least two circuit layers. In such an embodiment, when the first circuit layer 210 is formed on the substrate 205, the first circuit layer 210 may be electrically connected to the circuit layer in the substrate 205. In some other embodiments, the substrate 205 may be a rigid substrate having a smooth surface, such that the subsequently formed elements also have a flat top surface. For example, the substrate 205 may be a glass substrate.

In some embodiments, the first circuit layer 210 may include a metal material formed by a deposition process. For example, the first circuit layer 210 may include a metal material formed by vapor deposition, sputtering, electroplating, other suitable deposition techniques or a combination of the above. The metal material of the first circuit layer 210 is formed during a deposition process using a patterned mask or subjected to a followed patterning process after the deposition process, such that the first circuit layer 210 may have at least one first joint pad 212 and other conductive portions (such as, a trace). In some examples, the metal material of the first circuit layer 210 may include a copper metal layer or a copper alloy layer, but the present disclosure is not limited thereto.

Figure 2B:
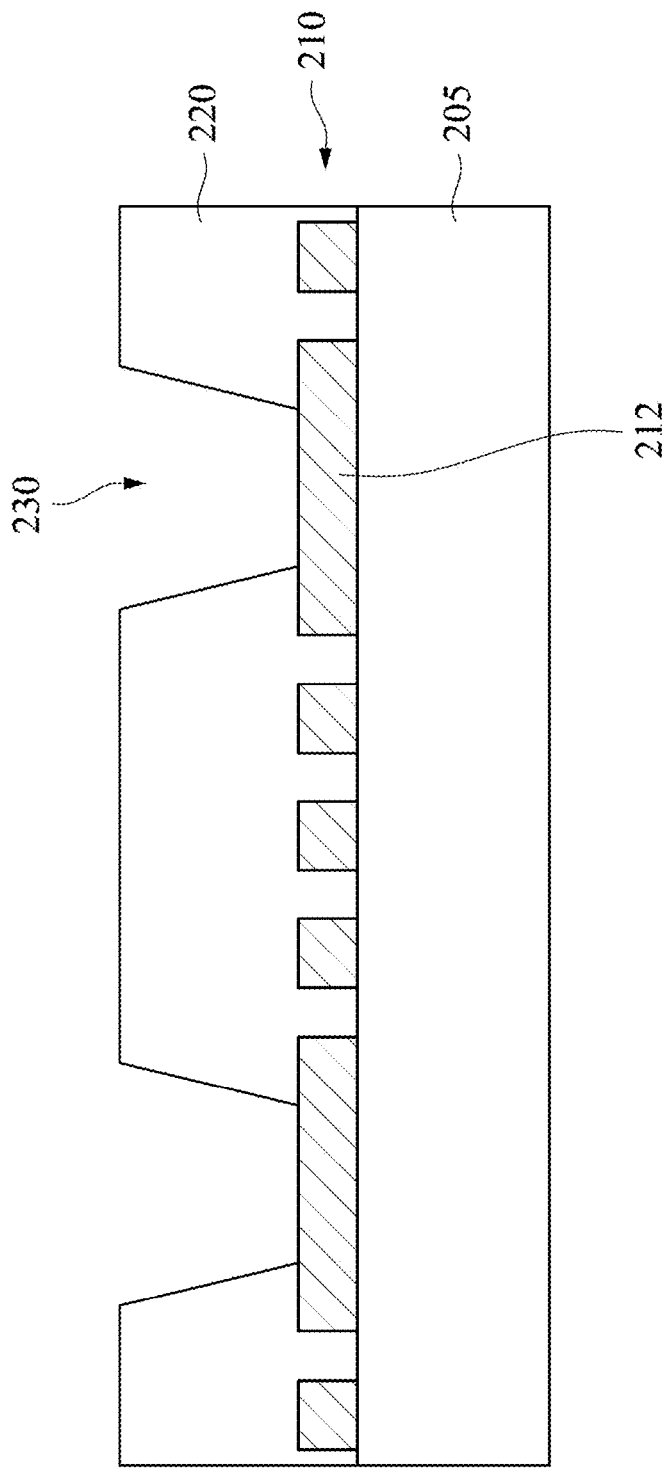

Referring to FIGS. 1 and 2B, the method 100 proceeds to step 104, where an opening 230 that exposes the first circuit layer 210 is formed in the dielectric layer 220. Specifically, a patterning process is performed on the dielectric layer 220 to form the opening 230 through the dielectric layer 220. The opening 230 extends from the top surface of the dielectric layer 220 to the top surface of the first circuit layer 210, such that portion of the first circuit layer 210 is exposed from the opening 230. For example, as shown in FIG. 2B, the opening 230 may expose the upper surface of the first joint pad 212. In some embodiments, the opening 230 above the first circuit layer 210 may be formed by a laser drill process, where a laser beam is unlikely to penetrate the first joint pad 212 to extend the opening 230 to the top surface of the first circuit layer 210.

Figure 2C:
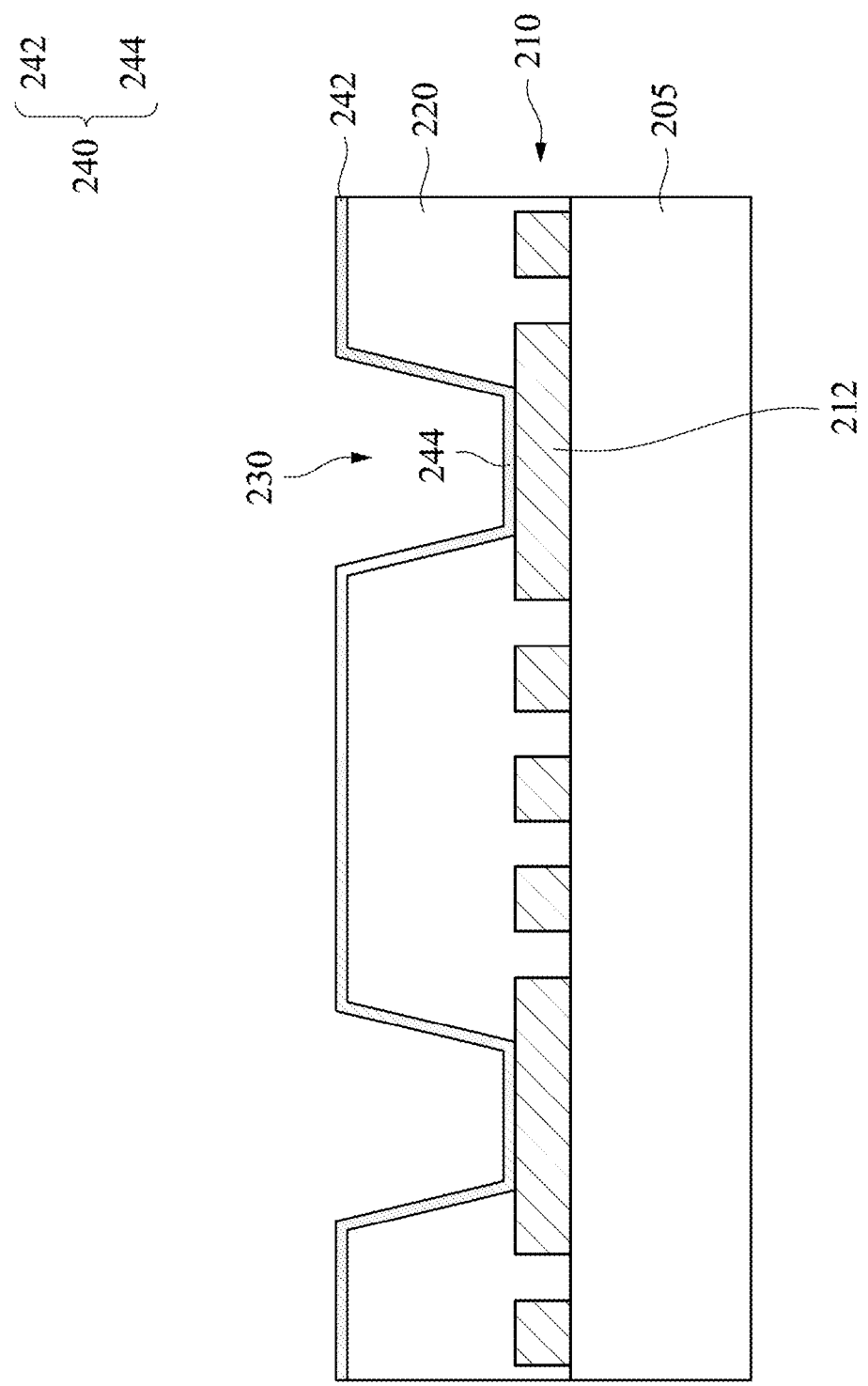

Referring to FIGS. 1 and 2C, the method 100 proceeds to step 106, where a seed layer 240 is formed on the dielectric layer 220 and in the opening 230. Specifically, the seed layer 240 is formed along the upper surface of the dielectric layer 220, the sidewalls of the opening 230, and the bottom surface of the opening 230, such that the seed layer 240 covers the structure shown in FIG. 2B. As shown in FIG. 2C, the seed layer 240 includes a first portion 242 located on the dielectric layer 220 and a second portion 244 located in the opening 230. In the embodiment shown in FIG. 2C, the first portion 242 covers the upper surface of the dielectric layer 220, but is not located in the opening 230. The second portion 244 is limited within the opening 230 and is not distributed to the dielectric layer 220 outside the opening 230. Because the opening 230 in FIG. 2B exposes portion of the first circuit layer 210, the second portion 244 in the opening 230 can directly contact the first circuit layer 210. In other words, the seed layer 240 can directly contact the first joint pad 212 to form a conductive path with the first circuit layer 210.

In some embodiments, the deposition process used to form the seed layer 240 may be sputtering, electroless plating, other suitable deposition techniques or a combination of the above. For example, the seed layer 240 with a thickness ranging from 0.5 μm to 1 μm may be formed by electroless plating, such that the subsequent metal material (such as the second circuit layer 270 in FIG. 2G) can be evenly formed above the first circuit layer 210 by electroplating. In some embodiments, the seed layer 240 may include an appropriate metal material, such as copper metal or copper alloy. The seed layer 240 may have a metal material same with or similar to that of the first circuit layer 210, so as to achieve impedance matching between the seed layer 240 and the first circuit layer 210.

When the opening 230 is formed by a laser drill process, a desmear process may be performed before deposition of the seed layer 240, so as to eliminate glue residue left due to the formation of the opening 230. Thus, an electrical connection quality between the seed layer 240 and the first circuit layer 210 can be improved, avoiding unexpected insulation between the seed layer 240 and the first circuit layer 210.

Figure 2D:
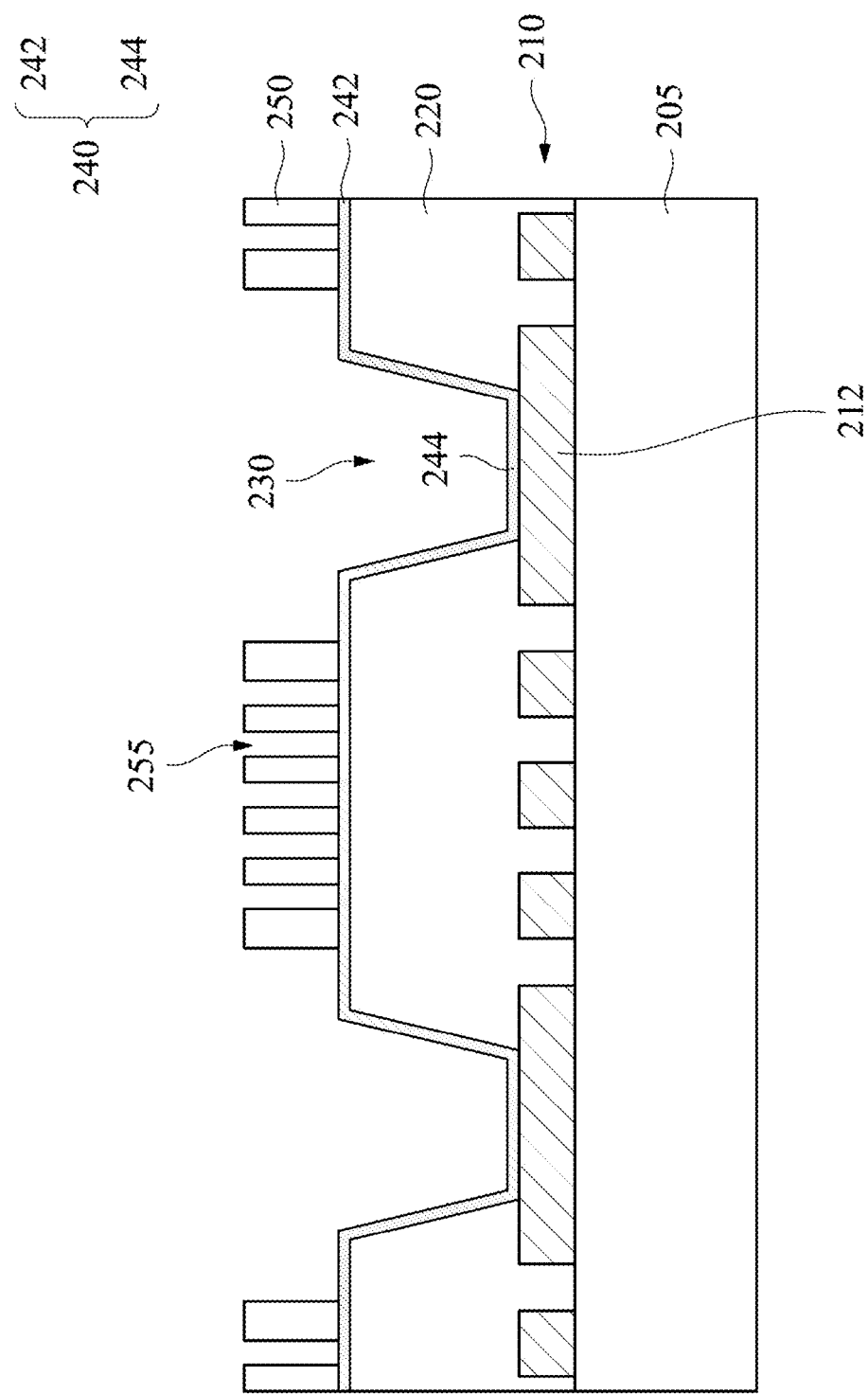

Referring to FIGS. 1 and 2D, the method 100 proceeds to step 108, where a mask layer 250 that exposes portion of the seed layer 240 is formed on the seed layer 240. Specifically, a photoresist material is formed on the seed layer 240, such that the photoresist material covers the seed layer 240. Afterwards, a light exposure process is performed according to the type (such as a positive or negative photoresist material) of the photoresist material. The photoresist material exposed or unexposed to the light is eliminated by a development process, thus forming the mask layer 250 having an opening 255.

The mask layer 250 exposes portion of the seed layer 240, such that the opening 255 has a pattern corresponding to the subsequently formed circuit layer. For example, the opening 255 may expose portion of the first portion 242 on the dielectric layer 220, thereby defining a trace pattern of the circuit layer in the subsequent process. The mask layer 250 may also expose the second portion 244 in the opening 230, thereby defining a blind via hole pattern of the circuit layer in the subsequent process. Because the mask layer 250 includes a photoresist material, the mask layer 250 may be formed by exposing the photoresist material to the light with the precision lithography equipment. As a result, the mask layer 250 has a fine pattern that facilitates manufacturing of a circuit with a fine line width in the subsequent process. For example, in an example of the opening 255 corresponding to the trace pattern of the circuit layer, the width of the opening 255 may range from 8 μm to 10 μm, but the present disclosure is not limited thereto.

Figure 2E:
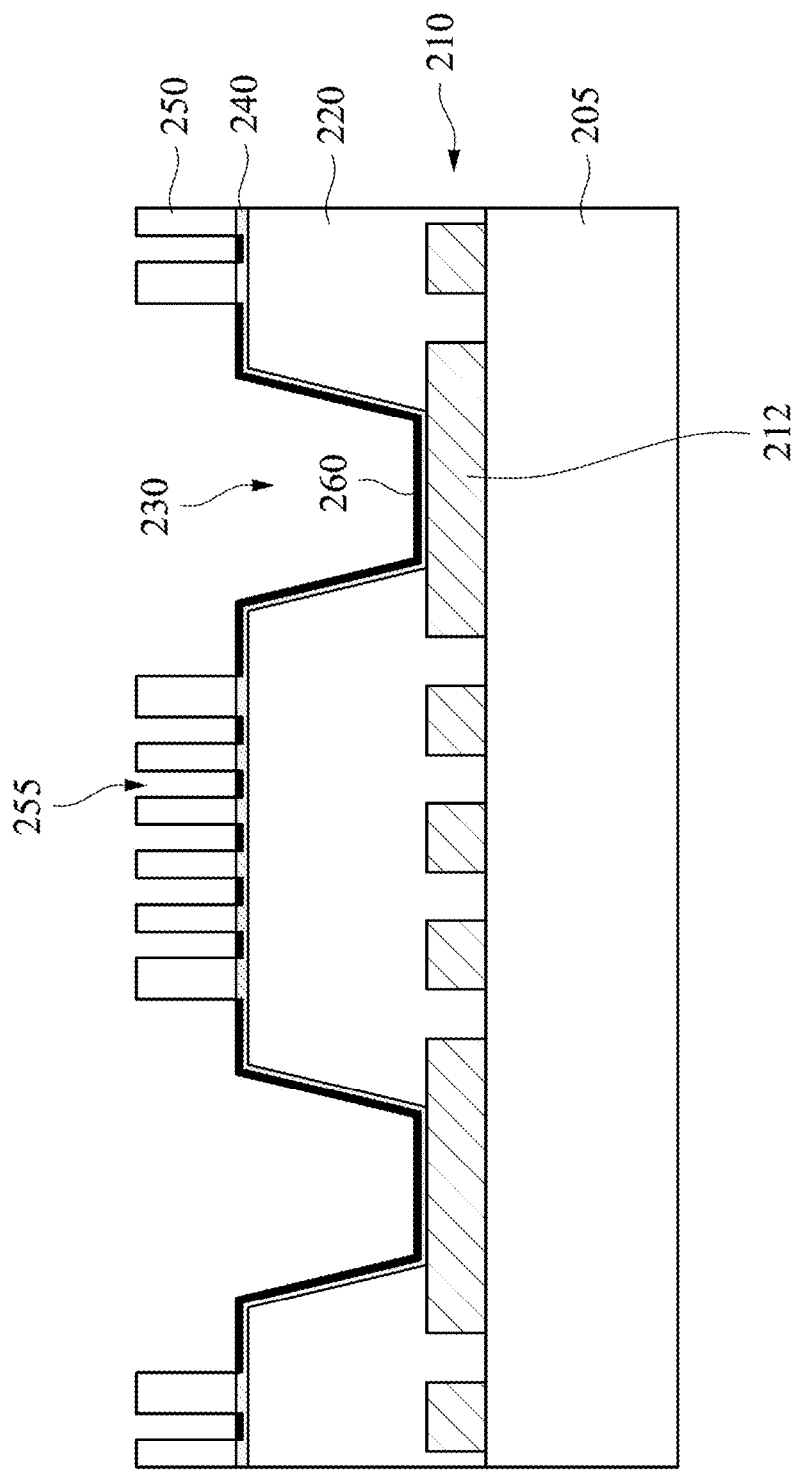

Referring to FIGS. 1 and 2E, the method 100 proceeds to step 110, where the seed layer 240 is treated with a metal levelling agent to form a levelled portion 260 on the top surface of the seed layer 240. A manner of treating the seed layer 240 by the metal levelling agent is, for example, micro etching. Specifically, the metal levelling agent is applied on the structure shown in FIG. 2D, such that portion of the seed layer 240 exposed by the mask layer 250 is subjected to treatment with the metal levelling agent. The metal levelling agent can reduce the roughness of the top surface of seed layer 240 to an arithmetical average roughness (Ra) range from 30 nm to 35 nm. Therefore, the levelled portion 260 is formed on the top surface of the treated seed layer 240, differentiating from the top surface of the untreated rest of the seed layer 240. In addition, in FIG. 2E and the subsequent drawings, the levelled portion 260 is indicated by thick black lines.

Figure 3A:
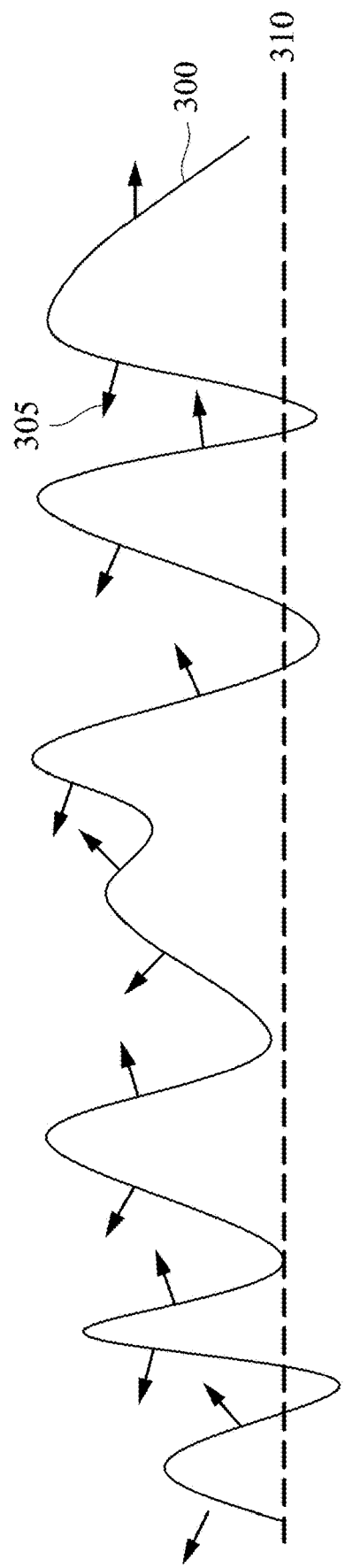
FIGS. 3A to 3B are schematic cross sectional views of a seed layer before and after treatment with a metal levelling agent according to some embodiments of the present disclosure.
Figure 3B:
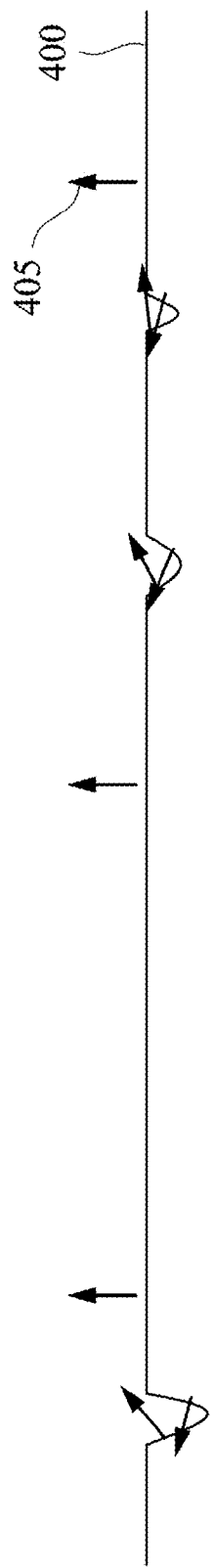

In order to describe the function of the metal levelling agent, FIG. 3A is a schematic cross sectional view of the seed layer before treatment with the metal levelling agent according to some embodiments of the present disclosure, and FIG. 3B is a schematic cross sectional view of the seed layer after treatment with the metal levelling agent. As shown in FIG. 3A, the untreated seed layer has relatively high surface roughness, and thus has a significantly undulating seed layer surface 300. If a metal material is deposited on such a seed layer surface 300, the metal material may grow outwards in growth directions shown by multiple arrows 305 in FIG. 3A. Because the directions shown by these arrows 305 are mostly inconsistent, the deposited metal material may grow in many different directions, thus producing a large number of grain boundaries.

Correspondingly, if the seed layer surface 300 can be first adjusted into a flat surface shown by the broken line 310, the growth directions of the metal material can be made consistent, thus forming a metal deposition layer with a small number of grain boundaries. FIG. 3B is a schematic cross sectional view of the seed layer surface 300 after treatment with the metal levelling agent by taking the broken line 310 as the treatment target. As shown in FIGS. 3A and 3B, under the effect of micro etching by the metal levelling agent, the material portion of the outermost layer of the seed layer surface 300 is levelled to form a seed layer surface 400 (deemed to be the broken line 310 in FIG. 3A). As compared with the seed layer surface 300, the seed layer surface 400 is approximately flat and thus can enable the deposited metal material to grow along the arrows 405 with relatively consistent directions. In other words, when the metal material is deposited on such a seed layer surface 400, the metal material can grow in directions shown by the arrows 405, thus forming a metal deposition layer with a small number of grain boundaries.

Figure 2F:
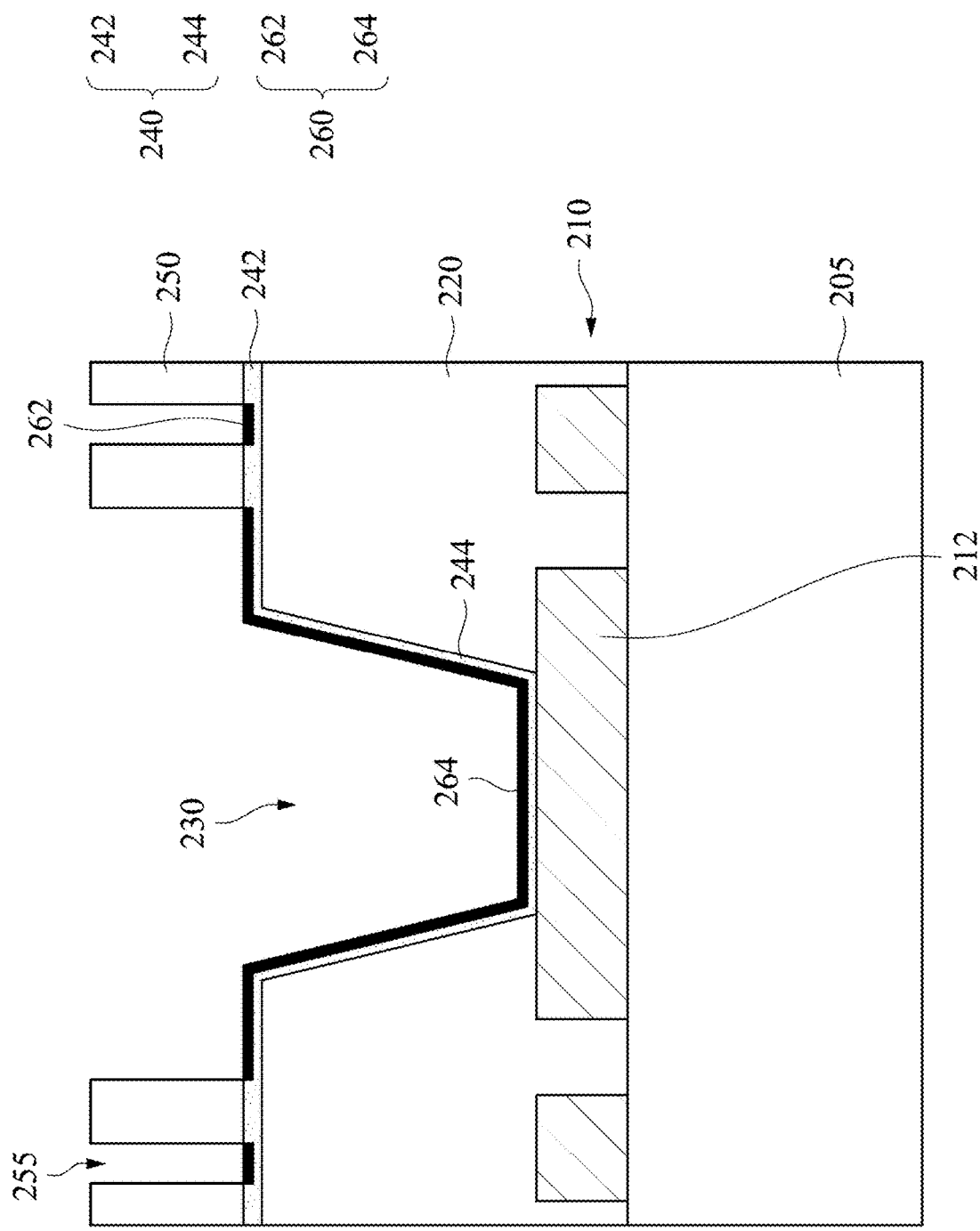
FIG. 2F is a partial enlarged diagram of the circuit board in FIG. 2E according to some embodiments of the present disclosure.

FIG. 2F is a partial enlarged diagram of the circuit board in FIG. 2E according to some embodiments of the present disclosure. As shown in FIG. 2F, the opening 255 of the mask layer 250 exposes portion of the first portion 242, such that the exposed portion of the first portion 242 is treated (for example, by micro etching) with the metal levelling agent by using the mask layer 250 as a mask. In this way, the top surface of the exposed first portion 242 has a first portion 262 of the levelled portion 260. Similarly, the mask layer 250 exposes the second portion 244 of the seed layer 240, such that the top surface of the second portion 244 in the opening 230 has a second portion 264 of the levelled portion 260. The first portion 262 and the second portion 264 of the levelled portion 260 have a low surface roughness after treatment with the metal levelling agent. Correspondingly, the seed layer 240 right below the mask layer 250 is not treated by the metal levelling agent and thus maintains the original high surface roughness.

In some embodiments, the levelled portion 260 of the seed layer 240 may have an appropriate thickness, such that the metal material has consistent growth directions. Specifically, the levelled portion 260 may have a thickness of at least one metal atom, such that the outermost atoms of the seed layer 240 form the levelled portion 260. For example, the average thickness of the levelled portion 260 may range from 1 to 2 angstroms. If the thickness of the levelled portion 260 is less than 1 angstrom, the levelled portion 260 may be too thin to maintain the average thickness. In some embodiments, the levelled portion 260 is merely distributed at the top surface of the seed layer 240 without contacting the first circuit layer 210, the dielectric layer 220, or both of them.

In some embodiments, the metal levelling agent may include an appropriate material, so as to achieve a micro etching effect for the seed layer 240. For example, in an embodiment where the seed layer 240 includes a copper metal material or copper alloy material, the metal levelling agent for treatment of the seed layer 240 may be selected from hydrogen peroxide, organic acid, inorganic acid, the like, and a combination of the above. In an embodiment where the seed layer 240 includes other metal materials, the metal levelling agent may include other proper solutions for etching the seed layer 240.

Figure 2G:
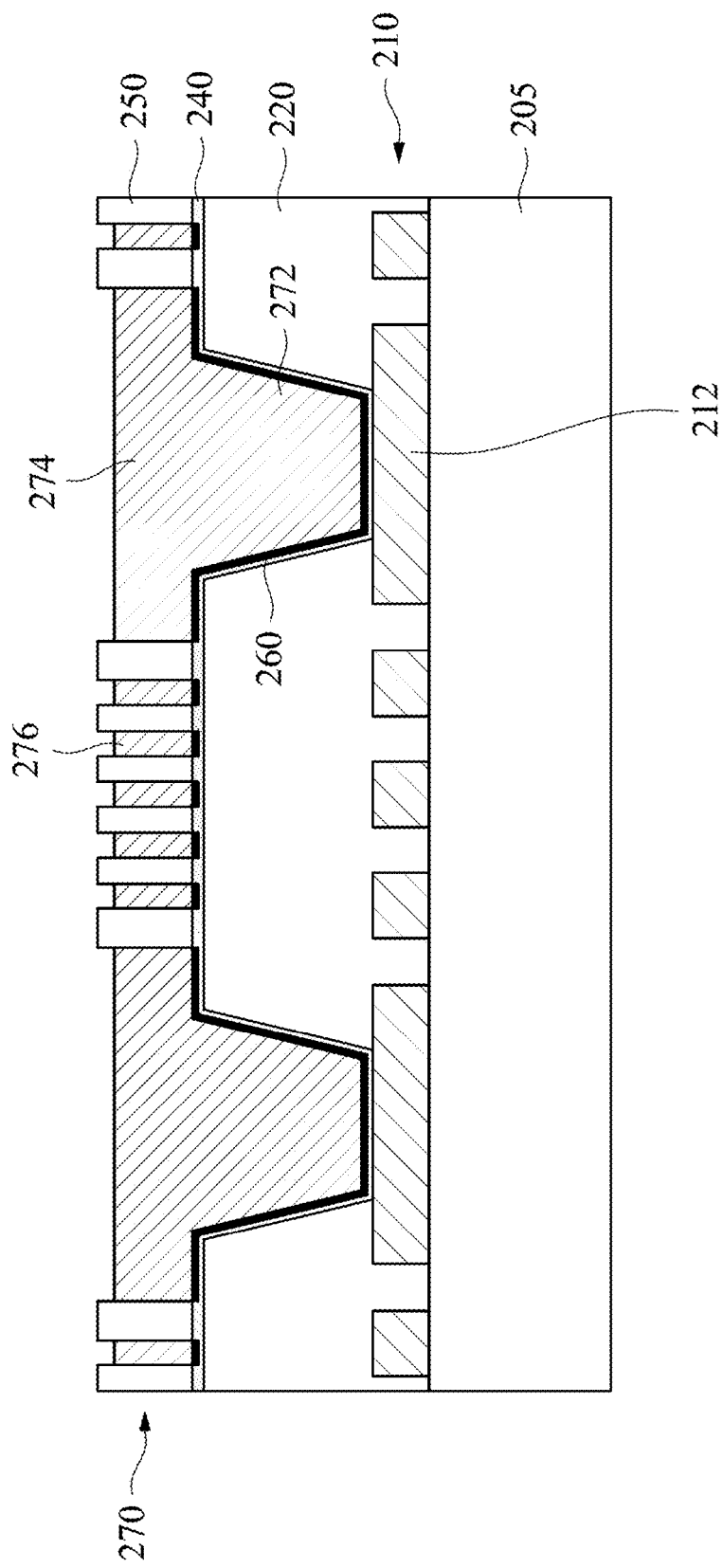

Referring to FIGS. 1 and 2G, the method proceeds to step 112, where a second circuit layer 270 is formed on the levelled portion 260 of the seed layer 240. Specifically, a metal material of the second circuit layer 270 is formed on the levelled portion 260 by a deposition process, such as vapor deposition, sputtering, electroplating, other suitable deposition techniques or a combination of the above. Because the second circuit layer 270 is directly formed on the levelled portion 260, the bottom surface of the second circuit layer 270 can directly contact the top surface of the levelled portion 260.

As shown in FIGS. 2E and 2G, the metal material of the second circuit layer 270 is formed not only in the opening 230, but also in the opening 255 of the mask layer 250. Therefore, the metal material may form conductive portions (for example, a trace and a joint pad) of the second circuit layer 270 according to patterns of the opening 230 and the mask layer 250. Specifically, the metal material of the second circuit layer 270 forms a blind via hole 272 corresponding to the first joint pad 212 in the opening 230. In the second circuit layer 270, a second joint pad 274 is further formed on the blind via hole 272 and in the pattern of the mask layer 250. The metal material of the second circuit layer 270 forms a second trace 276 adjacent to the second joint pad 274 in the opening 255 of the mask layer 250.

Because the surface roughness of the levelled portion 260 is reduced to improve the consistency in the growth directions of the metal material, the metal atoms can be regularly arranged along the flat surface provided by the levelled portion 260 during forming of the second circuit layer 270. As a result, the second circuit layer 270 formed by the process has a small number of grain boundaries. In other words, compared to a circuit layer formed on the seed layer not treated with the metal levelling agent, the second circuit layer 270 has a relatively low grain boundary density.

In this specification, the grain boundary density is measured by photographing a cross section of the circuit layer with an electron microscope and is defined according to the number of grain boundaries per 10 μm in the circuit layer in the cross section photograph. When the grain boundary density of the circuit layer is measured in such a manner, a high-precision grain boundary density can be obtained even if the circuit layer has a small number of grain boundaries.

Figure 4A:
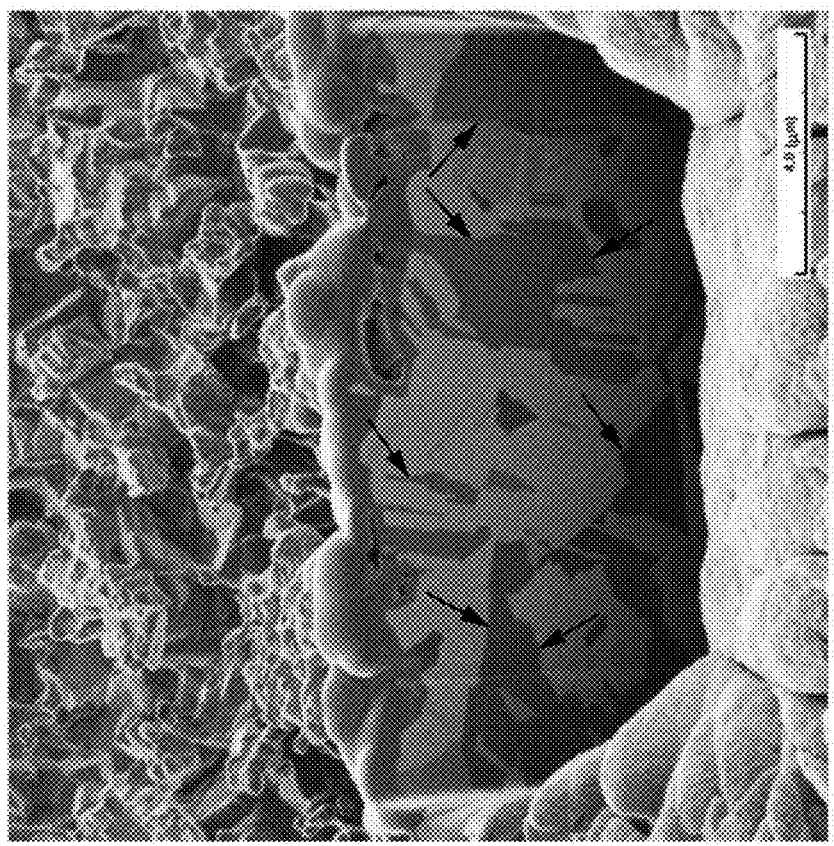
FIGS. 4A to 4C are cross section photographs of a circuit layer of a circuit board that are taken by using an electron microscope according to some embodiments of the present disclosure.
Figure 4C:
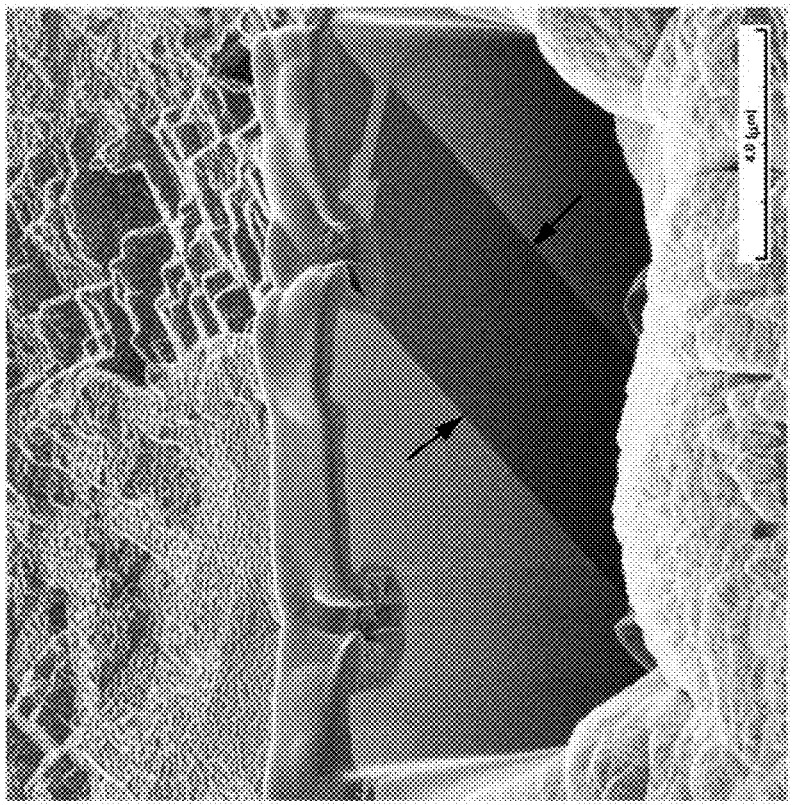
Figure 4B:
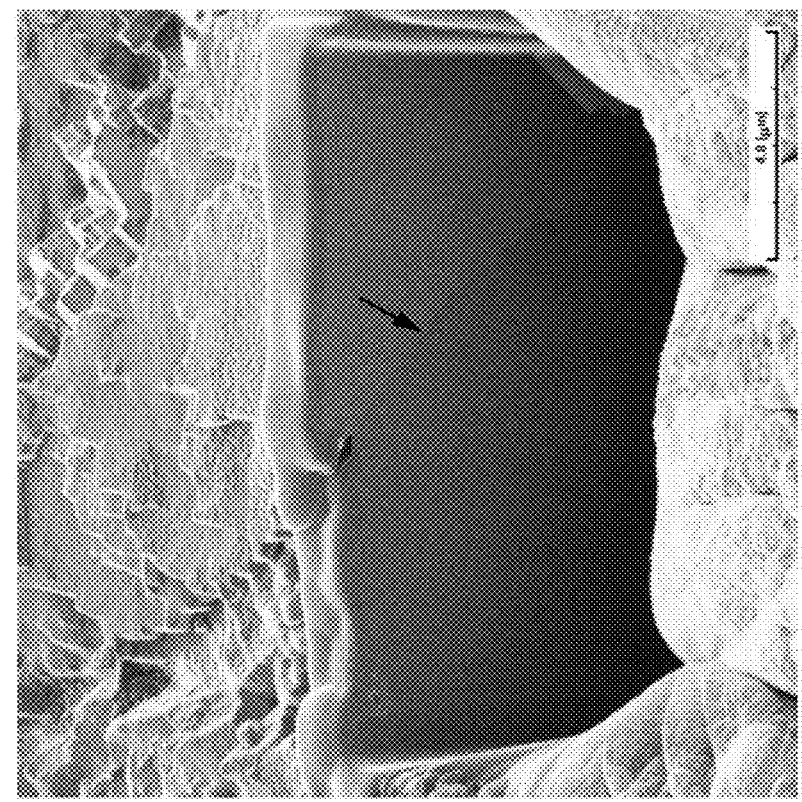

In order to describe the difference in grain boundary density more specifically, FIGS. 4A to 4C are cross section photographs of a second circuit layer taken by using an electron microscope according to some embodiments of the present disclosure. FIG. 4A shows a second circuit layer formed on a seed layer not treated with the metal levelling agent, where the arrows in the figure indicate positions of some grain boundaries. As shown in FIG. 4A, if the seed layer is not treated with the metal levelling agent, the grain boundary density of the second circuit layer ranges from 10 to 15 grain boundaries per 10 μm. FIGS. 4B and 4C show a second circuit layer formed on a seed layer treated with the metal levelling agent, where the arrows in the figure indicate positions of some grain boundaries. As shown in FIGS. 4B and 4C, if the seed layer is treated with the metal levelling agent, the grain boundary density of the second circuit layer may be reduced to about 1 to 2 grain boundaries per 10 μm.

Referring back to FIG. 2G, the second circuit layer 270 is formed on the levelled portion 260, and thus has a low grain boundary density. Further, due to the difference between the levelled portion 260 and the untreated portion of the seed layer 240, the grain boundary density of the second circuit layer 270 is less than the grain boundary density of the untreated portion of the seed layer 240 (namely, portion of the seed layer 240 directly contacting the first circuit layer 210). Because the second circuit layer 270 and the untreated portion of the seed layer 240 have different grain boundary densities, even when the second circuit layer 270 and the seed layer 240 are made from identical materials (for example, copper), they still have different material characteristics, which will be further described below.

In some embodiments, the second circuit layer 270 may include an appropriate metal material, for example, copper metal or copper alloy. The second circuit layer 270 may have a metal material same with or similar to that of the seed layer 240, so as to achieve impedance matching between the second circuit layer 270 and the seed layer 240. It should be noted that, because the growth directions of the metal material on the levelled portion 260 are relatively consistent, and the subsequently formed second circuit layer 270 grows along the foregoing direction, the levelled portion 260 and the second circuit layer 270 have similar atom arrangement manners. Therefore, in an embodiment where the levelled portion 260 and the second circuit layer 270 include the same metal material, there is an unobvious boundary between the levelled portion 260 and the second circuit layer 270.

In some embodiments, after the second circuit layer 270 is formed, the top surface of the second circuit layer 270 may be lower than the top surface of the mask layer 250. Thus, the pattern of the second circuit layer 270 is defined by the mask layer 250. In other embodiments, the top surface of the metal material of the second circuit layer 270 may be first higher than that of the mask layer 250, and a planarization process is performed on the metal material to form the top surface of the second circuit layer 270 coplanar with the top surface of the mask layer 250.

Figure 2H:
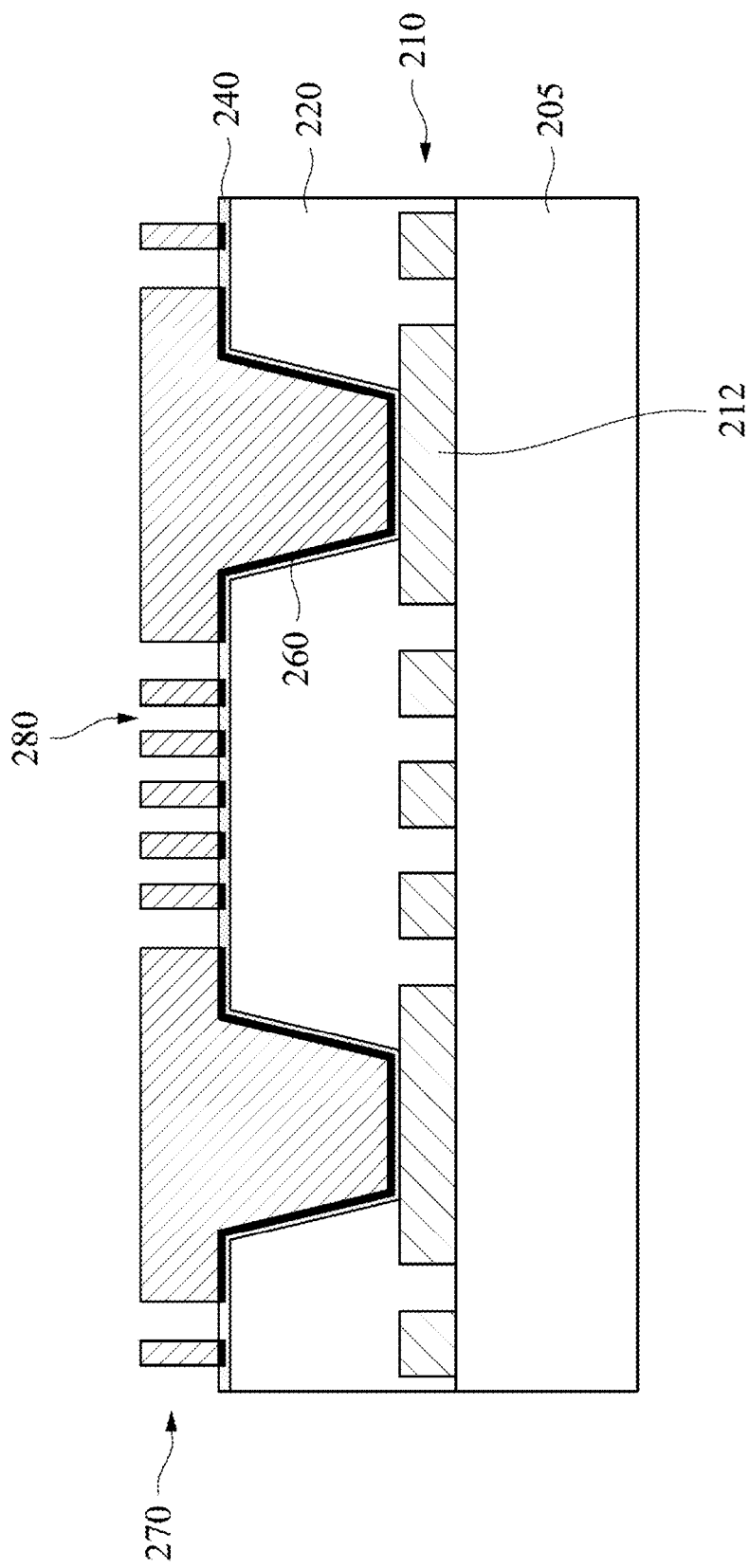

Referring to FIGS. 1 and 2H, the method 100 proceeds to step 114, where the mask layer 250 is removed. Specifically, a removing process may be performed on the mask layer 250 by using, for example, a stripper, such that the second circuit layer 270 and the seed layer 240 are retained above the first circuit layer 210 and the dielectric layer 220. After the mask layer 250 is removed, an opening 280 in the second circuit layer 270 is formed at the position of the seed layer 240 originally covered by the mask layer 250, thus exposing the seed layer 240 not treated with the metal levelling agent.

Figure 2I:
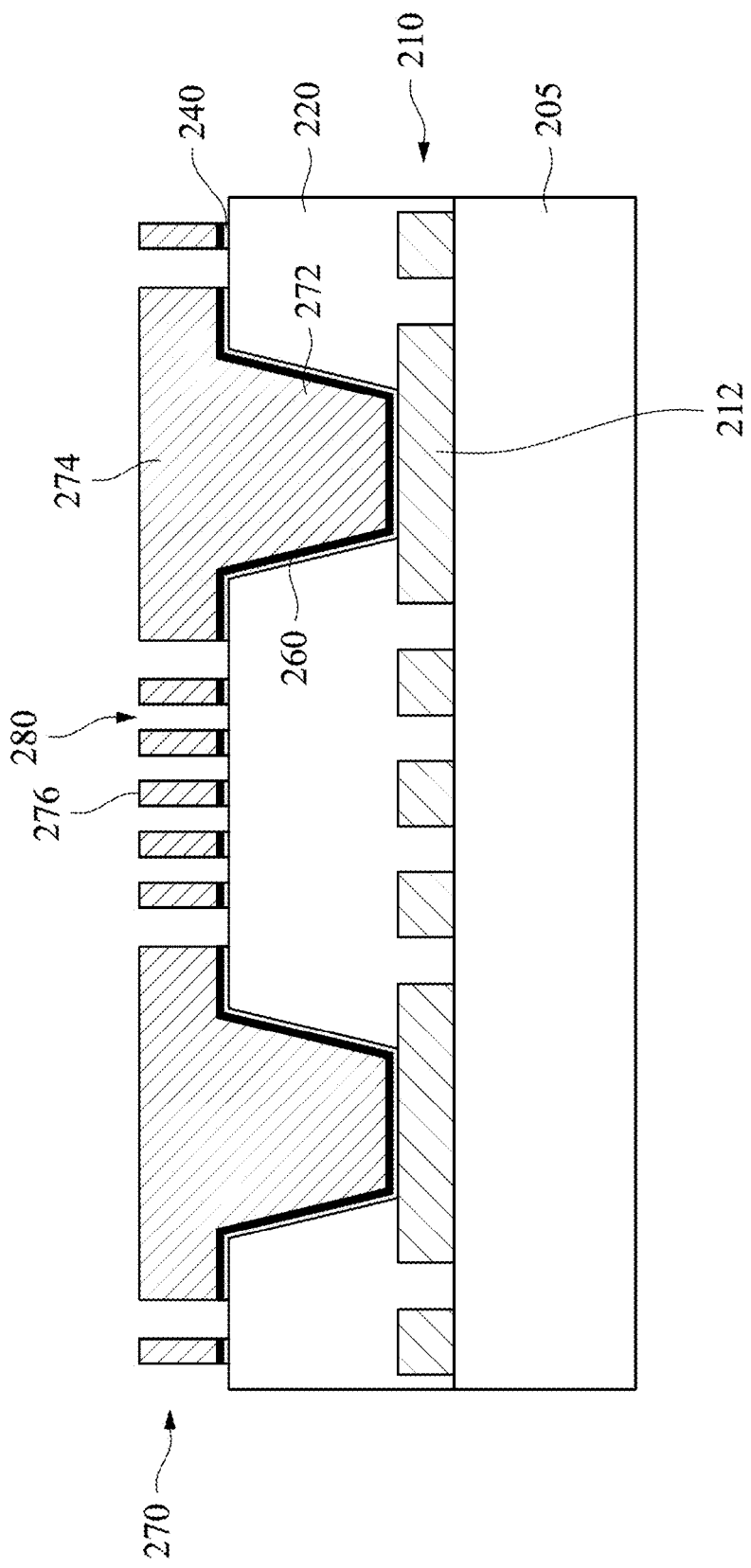

Referring to FIGS. 1 and 2I, the method 100 proceeds to step 116, where portion of the seed layer 240 exposed by the second circuit layer 270 is removed. Specifically, the opening 280 in the second circuit layer 270 exposes portion of the seed layer 240. The seed layer 240 exposed from the opening 280 may be removed by a selective etching process for the metal material. Because the etching process is selective for the metal material, the etching process may stop at the upper surface of the dielectric layer 220, such that the opening 280 extends to the upper surface of the dielectric layer 220.

In addition, an etchant used in the etching process has higher etching selectivity for the seed layer 240 than that for the second circuit layer 270, where an etching rate of the etchant for the seed layer 240 is greater than that for the second circuit layer 270. In detail, the untreated portion of the seed layer 240 has a high grain boundary density, thus providing more etching paths for the etchant, which allows the etchant to etch the untreated portion of the seed layer 240 along the grain boundaries. Correspondingly, the second circuit layer 270 growing on the levelled portion 260 has a low grain boundary density, so the etchant cannot easily etch the second circuit layer 270. Thus, when the etchant is applied to the second circuit layer 270 and the seed layer 240, the etchant can remove the seed layer 240 not covered by the second circuit layer 270, without significantly etching the second circuit layer 270.

For example, if the second circuit layer 270 is not formed on the levelled portion 260 and has a high grain boundary density, after the seed layer 240 with a thickness of about 1.5 µm is removed, the second circuit layer 270 also has an etching bias of about 7 µm. Correspondingly, because the second circuit layer 270 in FIG. 2I has a low grain boundary density, after the seed layer 240 with a thickness of about 1.5 µm is removed, the etching bias of the second circuit layer 270 may be reduced to 0 µm to 1 µm, that is, the etchant basically does not etch the second circuit layer 270.

According to the above-mentioned, because the second circuit layer 270 and the seed layer 240 have different grain boundary densities, the second circuit layer 270 can maintain the line width in the etching process of removing the seed layer 240. In other words, when the second circuit layer 270 is formed in the step shown by FIG. 2G, a line width (or referred to as a compensation line width) that may be etched in the process of removing the seed layer 240 is not needed to be reserved. Therefore, a second trace 276 with a fine line width may be formed in the second circuit layer 270, and a required distance between the second traces 276 may be reduced. This improves the circuit density of the second circuit layer 270. In some embodiments, the line width of the second circuit layer 270 before the process of removing the seed layer 240 may range from 8 µm to 10 µm, while the second circuit layer 270 subjected to the process of removing the seed layer 240 may have a line width ranging from 7 µm to 9 µm.

As shown in FIG. 2I, a circuit board 200 having a circuit layer with a low grain boundary density may be formed by means of the method 100. The circuit board 200 includes a first circuit layer 210, a dielectric layer 220 on the first circuit layer 210, a seed layer 240 on the dielectric layer 220, and a second circuit layer 270 on the seed layer 240. The seed layer 240 directly contacts a first joint pad 212 and a blind via hole 272, thus forming a conductive path between the first circuit layer 210 and the second circuit layer 270.

The top surface of the seed layer 240 includes a levelled portion 260, such that the grain boundary density of the second circuit layer 270 formed on the levelled portion 260 is less than that of the seed layer 240. For example, the second circuit layer 270 may have a grain boundary density ranging from 1 to 2 grain boundaries per 10 µm. The difference in grain boundary densities between the second circuit layer 270 and the seed layer 240 cause different etching rates of the etchant for the two layers. Therefore, the seed layer 240 may be selectively removed without using a mask, and the line width of the second circuit layer 270 is not significantly affected.

According to the foregoing embodiments of the present disclosure, a circuit board formed by using the method of the present disclosure includes a seed layer and a circuit layer on the seed layer. A portion of the top surface of the seed layer is treated with the metal levelling agent, such that the seed layer includes a levelled portion with low surface roughness. Because the circuit layer on the seed layer is formed on the levelled portion, the circuit layer may have a grain boundary density less than that of the seed layer, such that the etchant used to remove the seed layer has different etching rates for the seed layer and the circuit layer. Therefore, the circuit layer may maintain the original line width after the process of removing the seed layer, thus providing a trace with a fine line width in the circuit layer and further improving the circuit density in the circuit layer. Such a circuit layer can achieve the advantages of increasing the input/output (I/O) density of the circuit board, achieving high frequency and high rate of the circuit board, etc., thus improving the performance of the circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board, comprising:
   a first circuit layer;
   a dielectric layer on the first circuit layer;
   a seed layer on the dielectric layer and directly contacting the first circuit layer, wherein a top surface of the seed layer comprises a levelled portion; and
   a second circuit layer on the levelled portion of the seed layer, wherein a grain boundary density of the second circuit layer is lower than that of a portion of the seed layer directly contacting the first circuit layer.

2. The circuit board of claim 1, wherein the grain boundary density of the second circuit layer ranges from 1 to 2 grain boundaries per 10 μm.

3. The circuit board of claim 1, wherein a thickness of the levelled portion of the seed layer ranges from 1 to 2 angstroms.

4. The circuit board of claim 1, wherein the levelled portion is at the top surface of the seed layer without contacting the first circuit layer or the dielectric layer.

5. The circuit board of claim 1, wherein a line width of the second circuit layer ranges from 7 μm to 9 μm.

6. The circuit board of claim 1, wherein the seed layer and the second circuit layer comprises an identical metal material.

7. The circuit board of claim 1, wherein the seed layer and the second circuit layer comprises copper metal or copper alloy.

* * * * *